US009010225B2

(12) United States Patent
Hojo

(10) Patent No.: US 9,010,225 B2
(45) Date of Patent: Apr. 21, 2015

(54) DICING APPARATUS AND DICING METHOD

(75) Inventor: Yoshitami Hojo, Hachioji (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 440 days.

(21) Appl. No.: 12/809,919

(22) PCT Filed: Dec. 11, 2008

(86) PCT No.: PCT/JP2008/072514
§ 371 (c)(1),
(2), (4) Date: Jun. 21, 2010

(87) PCT Pub. No.: WO2009/081746
PCT Pub. Date: Jul. 2, 2009

(65) Prior Publication Data

US 2010/0269650 A1 Oct. 28, 2010

(30) Foreign Application Priority Data

Dec. 21, 2007 (JP) ................................ 2007-330131

(51) Int. Cl.
*G01R 1/067* (2006.01)
*B24B 49/12* (2006.01)
*B28D 5/00* (2006.01)

(52) U.S. Cl.
CPC .............. *B24B 49/12* (2013.01); *B28D 5/0064* (2013.01)

(58) Field of Classification Search
USPC ............................................ 438/462; 83/365
IPC ................................ B23D 59/002; B28D 5/024
See application file for complete search history.

(56) References Cited

U.S. PATENT DOCUMENTS

| | | | | |
|---|---|---|---|---|
| 5,945,834 | A * | 8/1999 | Nakata et al. | 324/750.05 |
| 6,111,421 | A * | 8/2000 | Takahashi et al. | 324/750.04 |
| 6,271,102 | B1 * | 8/2001 | Brouillette et al. | 438/462 |
| 6,475,877 | B1 * | 11/2002 | Saia et al. | 438/460 |

(Continued)

FOREIGN PATENT DOCUMENTS

| | | | |
|---|---|---|---|
| EP | 1338371 | A1 | 8/2003 |
| JP | 7-7028 | A | 1/1995 |

(Continued)

OTHER PUBLICATIONS

International Preliminary Report on Patentability (Chapter I) dated Jul. 1, 2010 with English translation.

(Continued)

*Primary Examiner* — Kenneth E Peterson
(74) *Attorney, Agent, or Firm* — Birch, Stewart, Kolasch & Birch, LLP

(57) ABSTRACT

A dicing apparatus according to a first aspect of the present invention includes: a work table on which a work is mounted; a processing device which processes the work; an imaging device which images the work on the work table; a plurality of moving device which move the work table, the processing device, and the imaging device relatively to each other; and an alignment camera which is provided on the same moving device as the work table so as to face the imaging device, and which performs imaging in the direction toward the portion where the imaging device is provided. According to the dicing apparatus configured in this way, it is possible to easily measure the relative position of the imaging device and the processing device without processing a dummy work, and it is possible to perform excellent dicing processing without lowering the efficiency of the dicing apparatus.

5 Claims, 8 Drawing Sheets

(56) References Cited

U.S. PATENT DOCUMENTS

| | | | | |
|---|---|---|---|---|
| 6,856,029 | B1 * | 2/2005 | Daniel et al. | 257/797 |
| 8,027,528 | B2 * | 9/2011 | Ishii et al. | 382/141 |
| 2001/0044256 | A1 | 11/2001 | Sekiya | |

FOREIGN PATENT DOCUMENTS

| | | | |
|---|---|---|---|
| JP | 8-37168 | A | 2/1996 |
| JP | 2001-332515 | A | 11/2001 |
| JP | 2002-192367 | A | 7/2002 |
| JP | 2002-280328 | A | 9/2002 |
| TW | 490806 | B | 6/2002 |

OTHER PUBLICATIONS

International Search Report dated Jan. 27, 2009.

Japanese Office Action dated May 14, 2013 for Application No. 2009-547028.

* cited by examiner

DICING APPARATUS AND DICING METHOD

TECHNICAL FIELD

The present invention relates to a dicing apparatus and a dicing method which divide, into individual chips, a work, such as a wafer in which semiconductor devices and electronic components are formed.

BACKGROUND ART

A dicing apparatus which performs cutting and grooving processing to a work, such as a wafer in which semiconductor devices and electronic components are formed, includes a blade which is rotated at high speed by a spindle, a work table which holds the work, cleaning device which cleans the work after dicing, various moving shafts which changes the relative position between the blade and the work, and the like.

FIG. 1 shows an example of a dicing apparatus. A dicing apparatus 10 is provided with a processing section 20 which includes a high-frequency motor built-in type spindles 22 and 22 which are arranged to face each other to serve as processing device, and at the tip of each of which a blade 21 and a wheel cover (not shown) are attached, imaging device 23 which images the surface of a work W, and a work table 31 which sucks and holds the work W.

In addition to the processing section 20, the dicing apparatus 10 is configured by further including a cleaning section 52 that performs spin cleaning of the worked work W, a load port 51 that mounts thereon a cassette storing a number of works W each of which is mounted on a frame F, transporting device 53 that transports the work W, a controller (not shown) that performs control of each of the sections, and the like.

As shown in FIG. 2, the processing section 20 is configured such that a X table 33, which is guided by X guides 34 and 34 provided on a X base 36 and which is driven by a linear motor 35 in the X direction shown by arrows X-X in the figure, is provided, and such that the work table 31 is provided on the X table 33 via a rotating table 32 which is rotated in the θ direction.

On the other hand, Y tables 41 and 41, which are guided by Y guides 42 and 42 and which are driven by a stepping motor and a ball screw (both not shown) in the Y direction shown by arrows Y-Y in the figure, are provided on the side surface of a Y base 44. A Z table 43 which is driven by drive device (not shown) in the Z direction shown by arrows Z-Z in the figure is provided on each of the Y tables 41. The high-frequency motor built-in type spindle 22, at the tip of which the blade 21 is attached, and the imaging device 23 (not shown in FIG. 2; see FIG. 1) are fixed to the Z table 43. Since the processing section 20 is configured as described above, the blade 21 is index-fed in the Y direction and is cutting-in fed in the Z direction, while the work table 31 is cutting-fed in the X direction.

The spindles 22 are both rotated at high speed of 1,000 rpm to 80,000 rpm, and a supply nozzle (not shown), which supplies cutting fluid so as to immerse the work W in the cutting fluid, is provided in the vicinity of the spindles 22 (see, for example Patent Document 1).

Further, in recent years, a laser dicing apparatus has also been used for the processing of the work W. The laser dicing apparatus is configured such that, instead of using the blade 21, a laser beam is made incident on the work W by adjusting the condensing point of the laser beam to a position inside the work W, so as to allow a plurality of reformed regions to be formed inside the work W by multi-photon absorption, and such that the work is then expanded so as to be divided into separate chips T.

The laser dicing apparatus includes the load port, the transporting device, the work table, and the like, similarly to the dicing apparatus 10, and is configured as shown in FIG. 3 such that, similarly to the spindle 22, laser heads 61 serving as processing device are provided in the processing section 20 so as to face each other.

The laser head 61 is configured by a laser oscillator 61A, a collimator lens 61B, a mirror 61C, a condensing lens 61D, and the like, and is configured such that a laser beam L oscillated from the laser oscillator 61A is formed into a horizontally parallel beam by the collimator lens 61B and is perpendicularly reflected by the mirror 61C so as to be condensed by the condensing lens 61D (see, for example, Patent Document 2).

When the condensing point of the laser beam L is set on the inside in the thickness direction of the work W mounted on the work table 31, the energy of the laser beam L transmitted through the surface of the work W is concentrated at the condensing point as shown in FIG. 4(*a*), so that a reformed region P, such as a crack region, a melting region, a refractive-index change region, is formed by multi-photon absorption in the vicinity of the condensing point inside the work W.

When the work W is moved in the horizontal direction, the plurality of reformed regions P are formed side by side in the inside of the work W as shown in FIG. 4(*b*). In this state, the work W is divided from the reformed region P as a starting point naturally or by applying a slight external force. In this case, the work W is easily divided into chips, without the chipping being generated on the front surface and the rear surface of the work W.

In the dicing apparatus 10 and the laser dicing apparatus which are configured as described above, before the dicing is performed, the relative distance between the imaging position of the imaging device and the processing position of the processing device is measured, and is adjusted as required.

Patent Document 1: Japanese Patent Application Laid-Open No. 2002-280328

Patent Document 2: Japanese Patent Application Laid-Open No. 2002-192367

DISCLOSURE OF THE INVENTION

Problem to be Solved by the Invention

Conventionally, the measurement of the relative distance is performed in such a manner that the dicing processing of the work is tentatively performed by the processing device, and that the processed groove formed on the work is actually imaged by the imaging device. For this reason, it is necessary to prepare many dummy works used for the tentative processing. Further, in the dicing apparatus using the blade, it is necessary to perform the processing operation for measuring the relative position each time the blade is exchanged. This is a major cause of lowering the efficiency of the dicing apparatus.

The present invention has been made to solve the above described problems. An object of the present invention is to provide a dicing apparatus and a dicing method which are capable of easily measuring the relative position between the imaging device and the processing device without processing the dummy work.

Device for Solving the Problems

To this end, a dicing apparatus according to a first aspect of the present invention is featured by including: a work table on which a work is mounted; a processing device which processes the work; an imaging device which images the work on the work table; a plurality of moving device which move the work table, the processing device, and the imaging device relatively to each other; and an alignment camera which is provided on the same moving device as the work table so as to face the imaging device, and which performs imaging in the direction toward the portion where the imaging device is provided.

Further, a dicing apparatus according to a second aspect of the present invention is featured in that in the first aspect, a reference mark, which can be imaged by the alignment camera and the imaging device, is provided at the center or near the center of the visual field of the alignment camera.

Further, a dicing apparatus according to a third aspect of the present invention is featured in that, in one of the first and second aspects, the reference mark is movably provided so as to be able to be positioned at the center of the visual field of the alignment camera, or near the center of the visual field, and outside the visual field.

In the dicing apparatus according to the present invention, the dicing of the work is performed in such a manner that the work table on which the work is mounted, and the processing device, such as the blade rotated by the spindle, and the laser, are moved by the moving device relatively to each other in each of the X, Y, Z and θ directions. The work is imaged by the imaging device before and during the dicing.

The dicing apparatus is provided with the alignment camera which is provided on the same moving device as the work table so as to face the imaging device, and which performs imaging in the direction toward the portion where the imaging device is provided. The reference mark, which can be imaged by the alignment camera and the imaging apparatus, is provided at the center of the visual field of the alignment camera, or near the center of the visual field. The reference mark is movably provided so as to be able to be positioned at the center of the visual field of the alignment camera, or near the center of the visual field, and outside the visual field.

In a dicing method according to the present invention, in the dicing apparatus configured as described above, the position coordinates of the imaging device with respect to the alignment camera are acquired by simultaneously imaging the reference mark by the alignment camera and the imaging device, and then the processing device, such as the tip of the blade and the laser head, is imaged by the alignment camera, so as to acquire the position coordinates of the processing device with respect to the alignment camera.

The thus obtained position coordinates of the imaging device with respect to the alignment camera are compared with the thus obtained position coordinates of the processing device with respect to the alignment camera, so that the relative position between the imaging device and the processing device is calculated. Thereby, the relative position between the imaging device and the processing device is easily measured without processing the dummy work, and the processing of the work is performed on the basis of the calculated relative position. Thus, it is possible to perform excellent dicing processing without lowering the efficiency of the dicing apparatus.

Advantages of the Invention

As described above, according to the dicing apparatus and the dicing method of the present invention, it is possible to easily measure the relative position between the imaging device and the processing device without processing the dummy work, and it is possible to perform excellent dicing processing without lowering the efficiency of the dicing apparatus.

DESCRIPTION OF SYMBOLS

Figure 1:
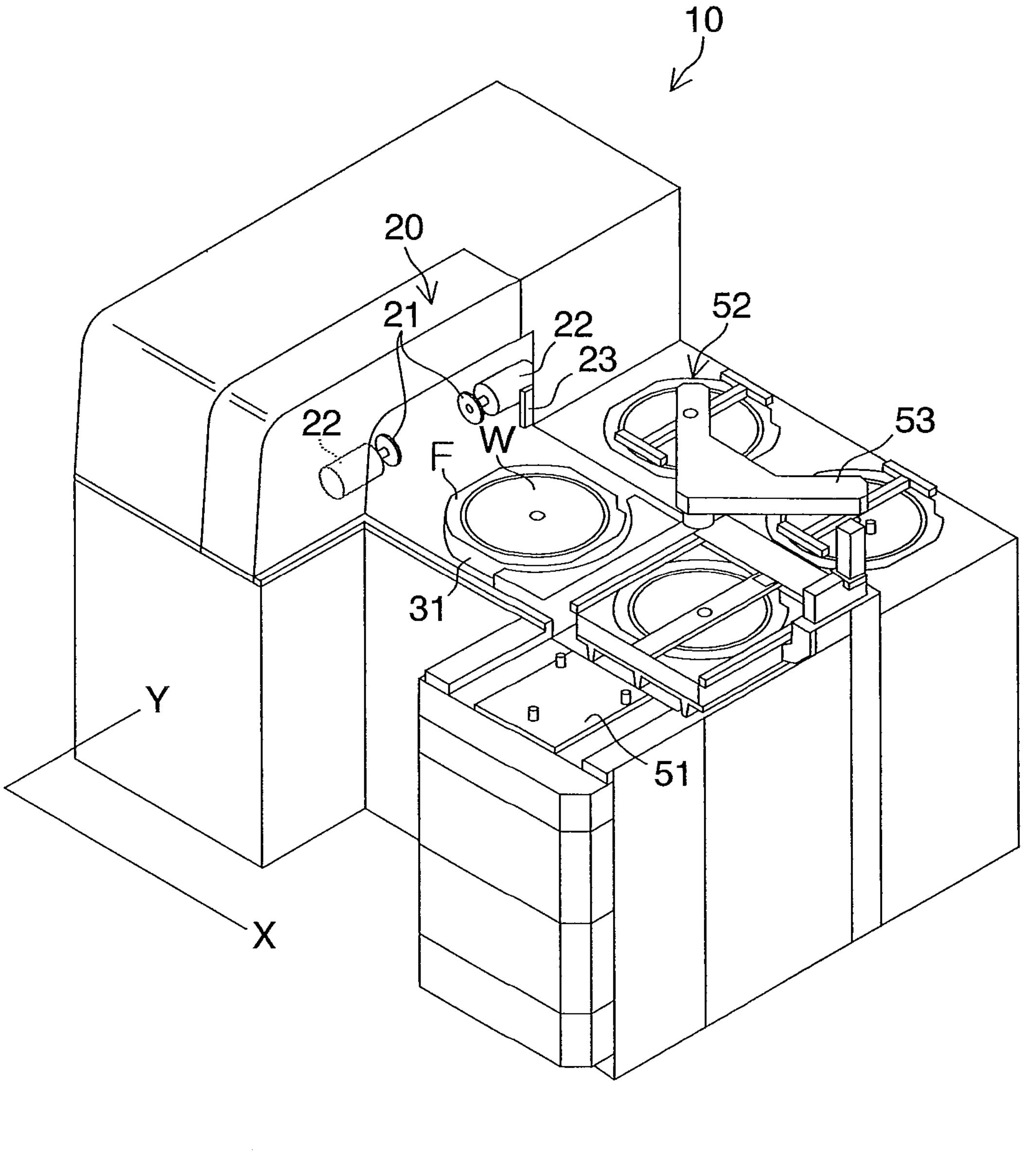
FIG. 1 is a perspective view showing appearance of a conventional dicing apparatus.
Figure 2:
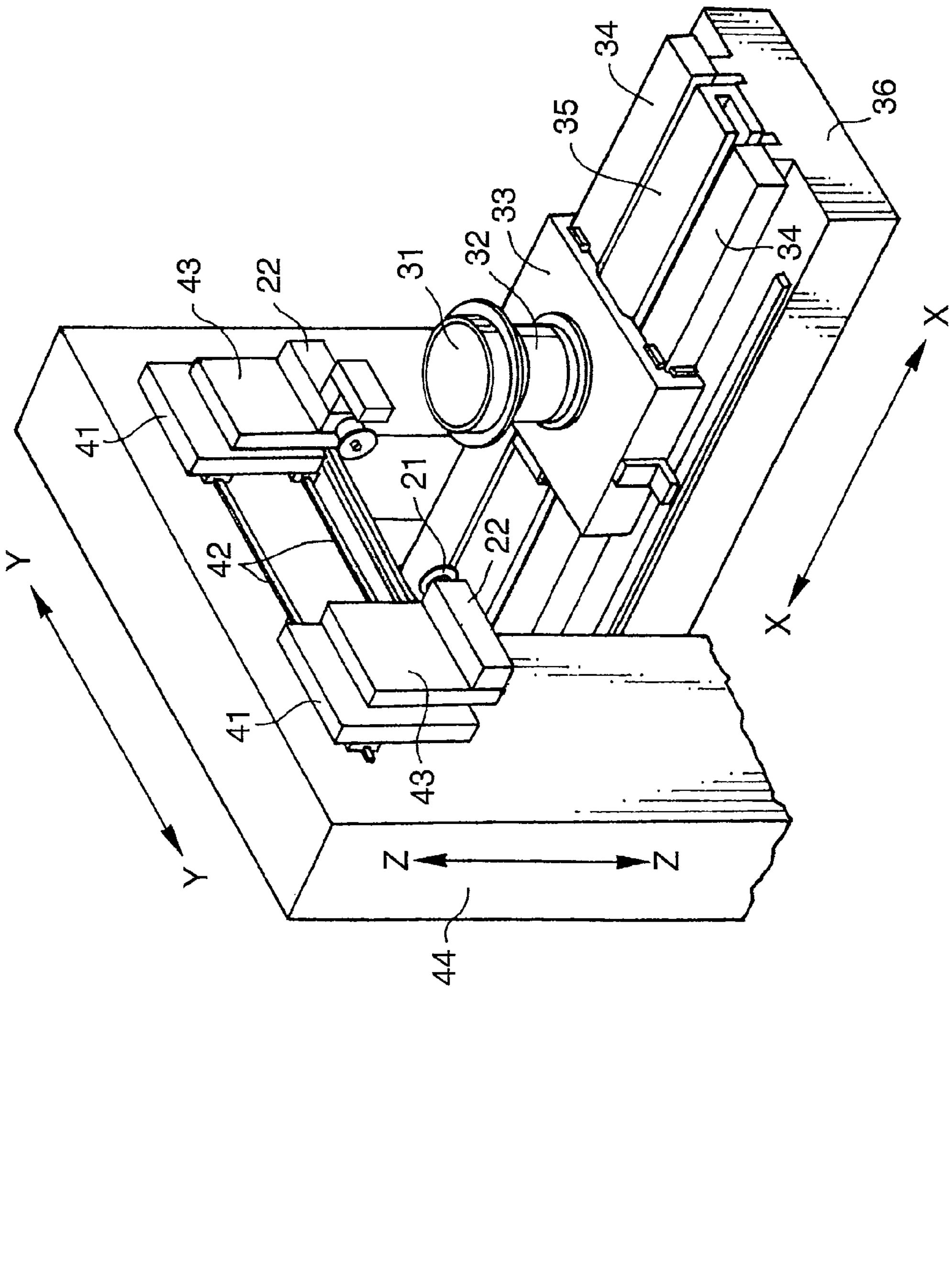
FIG. 2 is a perspective view showing a configuration of the processing section of the dicing apparatus shown in FIG. 1.

1, 10 Dicing apparatus
2 Alignment camera
3 Processing section
4 Camera main body
5 Imaging section
6 Reference mark
7 Reference mark drive device
21 Rotating blade
22 Spindle
23 Imaging device
31 Work table
32 Rotating table
33 X table
41 Y table
43 Z table
61 Laser head
W Work

BEST MODE FOR CARRYING OUT THE INVENTION

In the following, preferred embodiments of a dicing apparatus according to the present invention will be described in detail with reference to the accompanying drawings.

Figure 5:
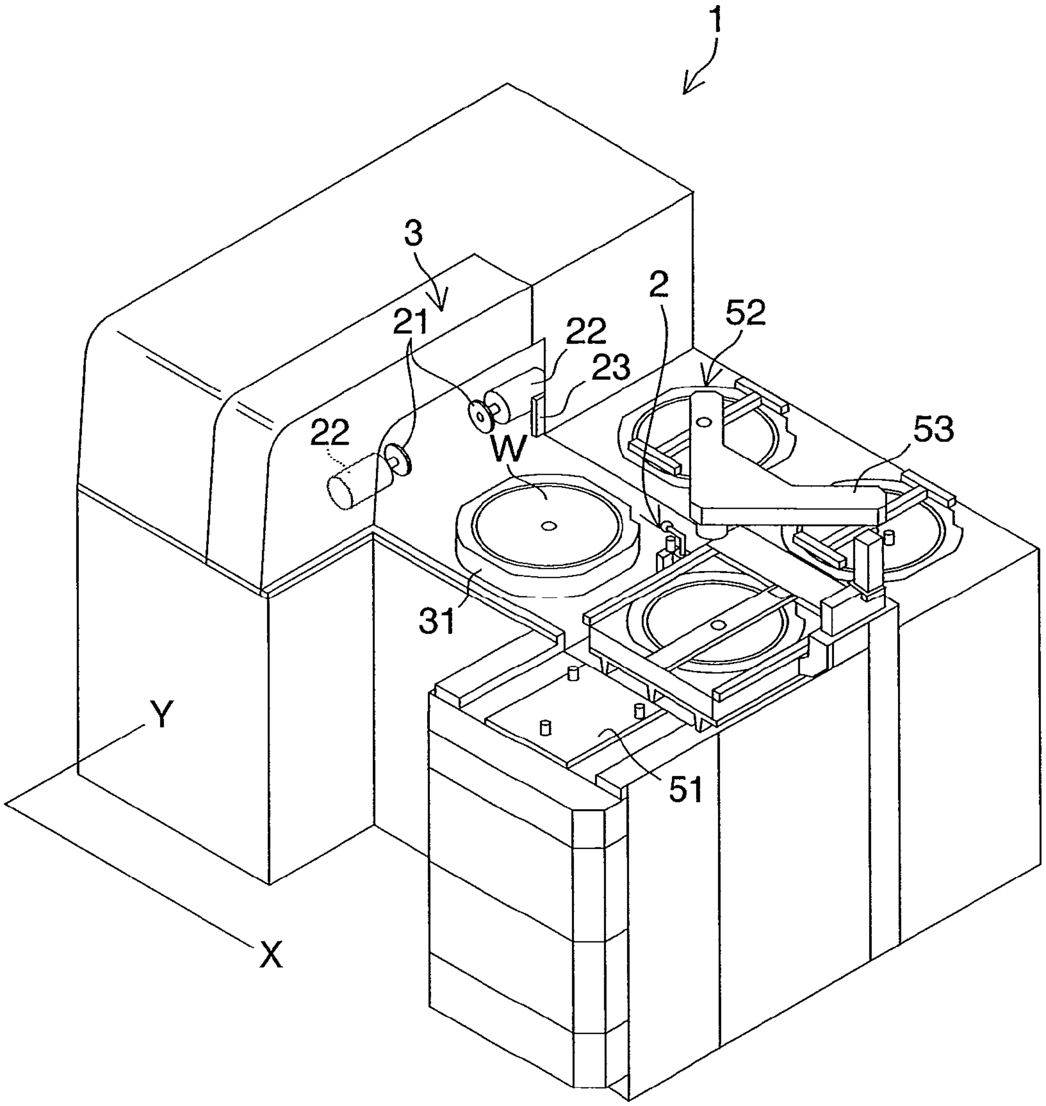
FIG. 5 is a perspective view showing appearance of a dicing apparatus according to an embodiment of the present invention.

First, a configuration of a dicing apparatus according to the present invention will be described. As shown in FIG. 5, a dicing apparatus 1 includes a processing section 3 having: spindles 22 and 22 which serve as processing device and are arranged so as to face each other, and at the tip of each of which a blade 21 and a wheel cover (not shown) are attached; a work table 31 on which a work W is mounted; imaging device 23 which images the work W on the work table 31; and an alignment camera 2 which is provided in the vicinity of the work table 31 so as to face the imaging device 23 and which performs imaging in the direction toward the portion where the imaging device 23 is provided. In addition to the processing section 20, the dicing apparatus 1 is configured by further including a cleaning section 52, a load port 51, transporting device 53, display device 24, controller (not shown), storing device (not shown), and the like.

Figure 6:
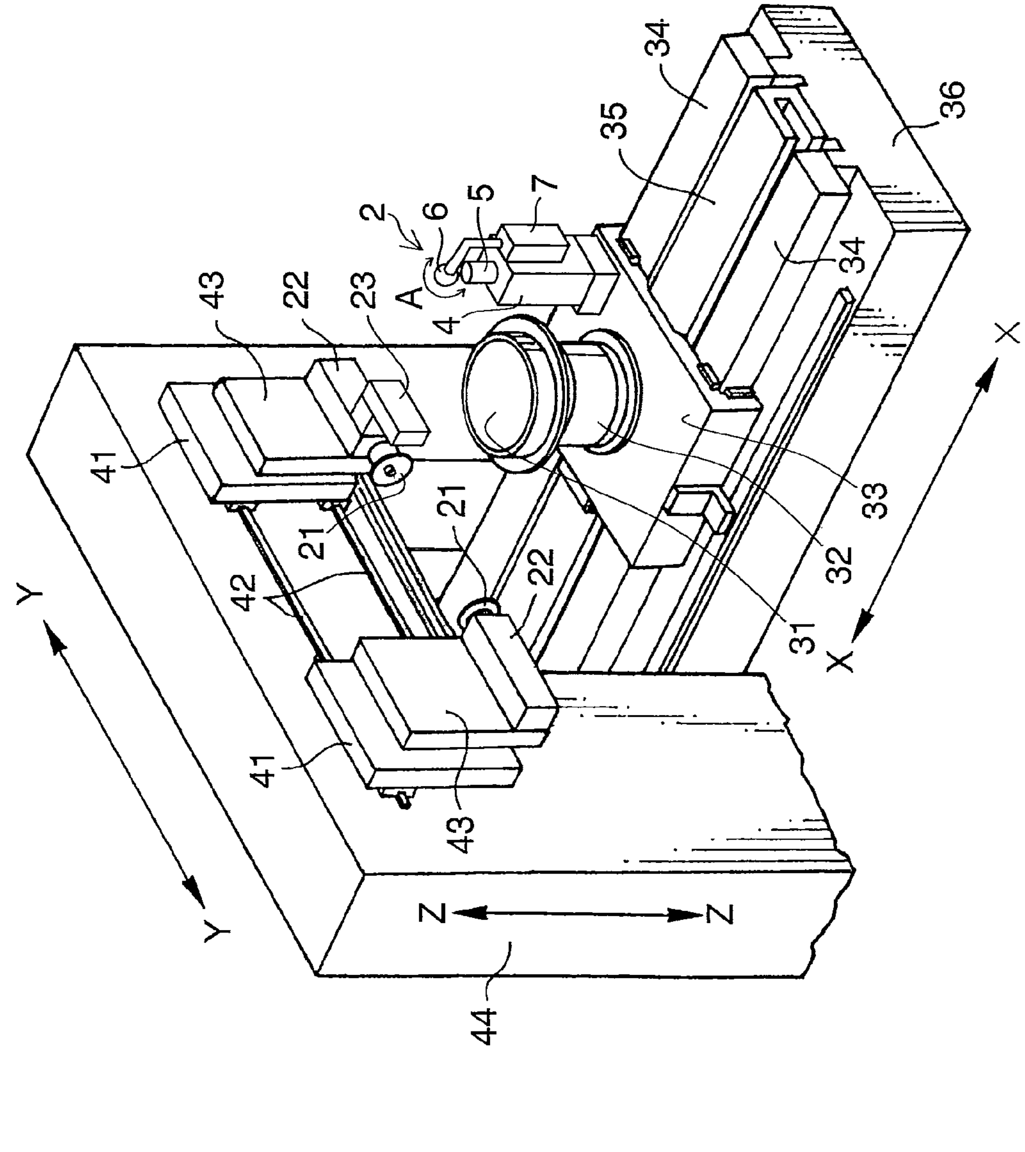
FIG. 6 is a perspective view showing a structure of the processing section of the dicing apparatus shown in FIG. 5.

As shown in FIG. 6, the processing section 3 includes an X table 33 which serves as moving device to effect cutting feed of the work table 31 in the X-X direction in the figure. A rotating table 32, which serves as moving device to rotate the work table 31 in the θ direction, and the alignment camera 2 are provided on the X table 33.

Further, the processing section 3 is provided with Y tables 41 and 41 each of which serves as moving device to effect movement in the Y-Y direction in the figure, and with Z tables 43 and 43 which are respectively provided on the Y tables 41 and 41, and each of which serves as moving device to effect movement in the Z-Z direction in the figure. The spindles 22 and 22 which are respectively attached to the Z tables 43 and 43 and to which the blades 21 and 21 serving as processing device are respectively attached, and the imaging device 23, such as a microscope, which is attached to the Z table 43, are cutting-in fed in the Z direction and index-fed in the Y direction by the Y and Z tables.

Figure 3:
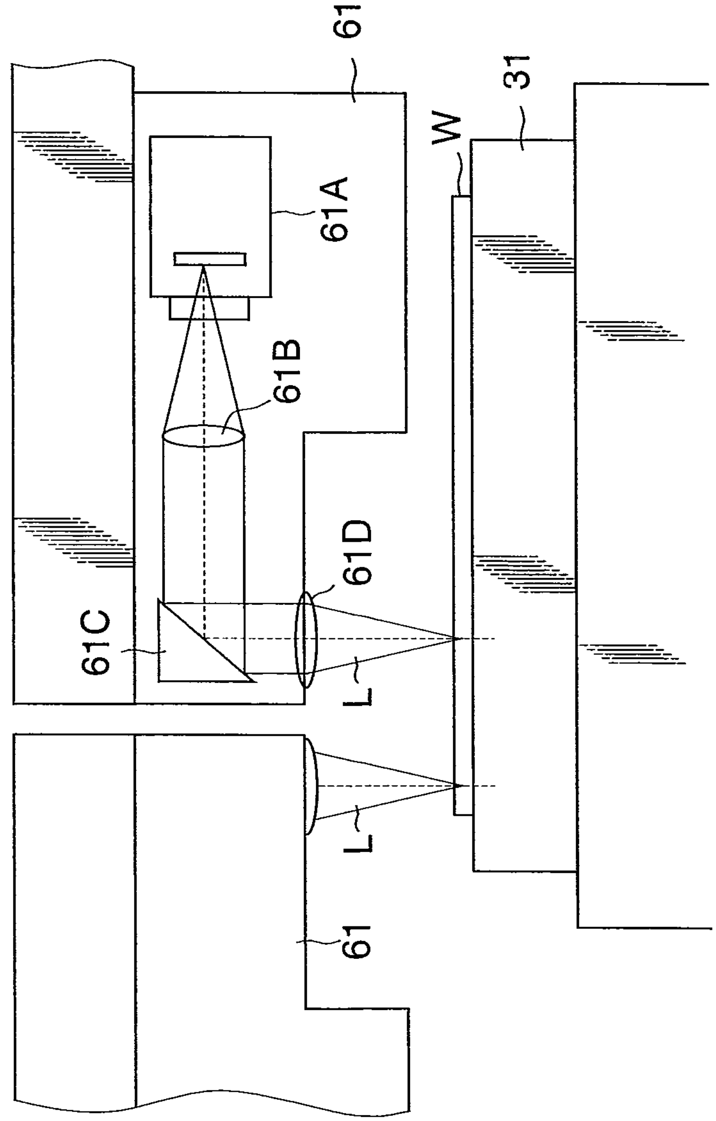
FIG. 3 is a side view showing a configuration of a dicing apparatus which performs dicing by a laser.
Figure 4:
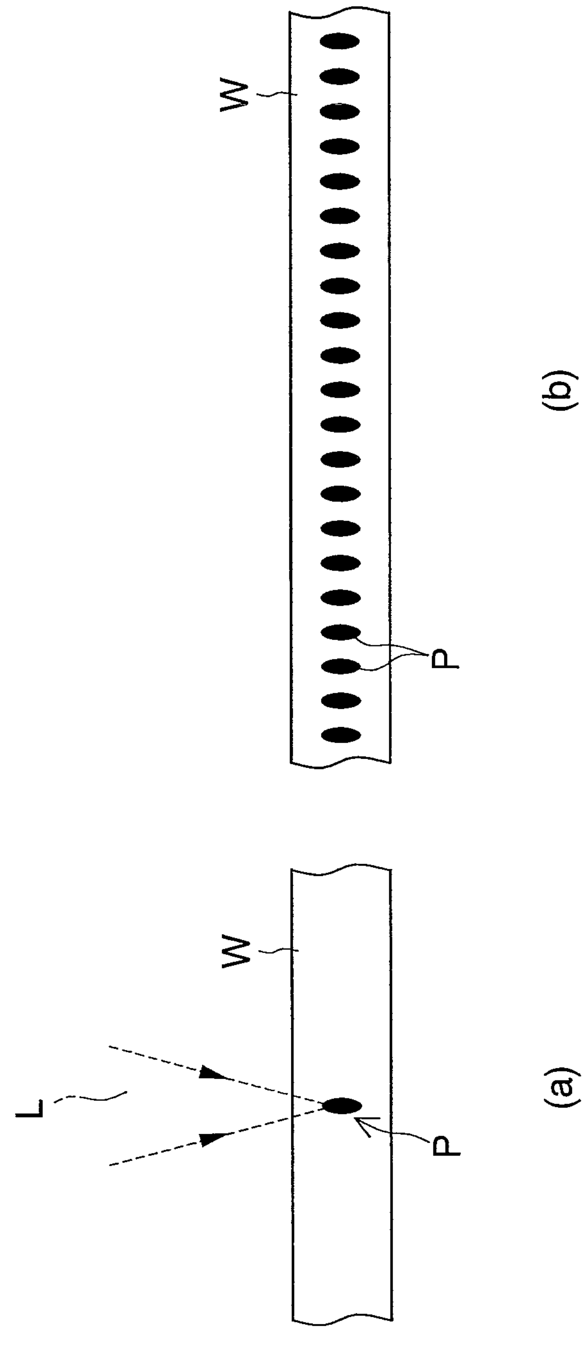
FIG. 4 is a side surface sectional view showing the principle of laser dicing.

Note that instead of the spindles 22 and 22 to which the blades 21 and 21 are respectively attached, a laser head 61 which is shown in FIG. 3 and serves as processing device may also be attached to each of the Z table 43 and 43.

The alignment camera 2 is provided such that the camera main body 4 thereof is fixed to the X table 33, and such that an imaging section 5 provided with a lens for imaging is directed to the upper portion in the Z direction, in which portion the imaging device 23 is provided. The imaging section 5 is protected by a cover (not shown) at the time when processing is performed in the processing section 3, and opens the cover to perform the imaging of the upper portion at the time when the alignment between the imaging device 23 and the blade 21 is performed.

In front of the imaging section 5, a reference mark 6 is provided so as to be positioned at the center or near the center of the visual field of the alignment camera 2. By a reference mark drive device 7 provided in the camera main body 4, the reference mark 6 is rotationally moved in the arrow A direction shown in FIG. 6. Thereby, the reference mark 6 can be positioned at the center of the visual field of the alignment camera 2, near the center of the visual field, and outside the visual field.

Next, a dicing method according to the present invention will be described. In the dicing apparatus 1, the work W is mounted on the work table 31. Then, the alignment operation, in which the cutting position of the work W and the position of the blade 21 are adjusted by imaging, by the imaging device 23, the pattern formed on the surface of the work W, is performed as the stage before the processing.

The alignment operation is performed on the basis of the relative position between the position imaged by the imaging device 23 and the position at which the processing is performed by the blade 21. The relative position is expressed by each of the coordinate axes of the X, Y, Z and θ directions which respectively correspond to the X table 33, the Y table 41, the Z table 43, and the rotating table 32. The coordinate values are processed by a controller, storage device (both not shown), and the like.

Figure 7:
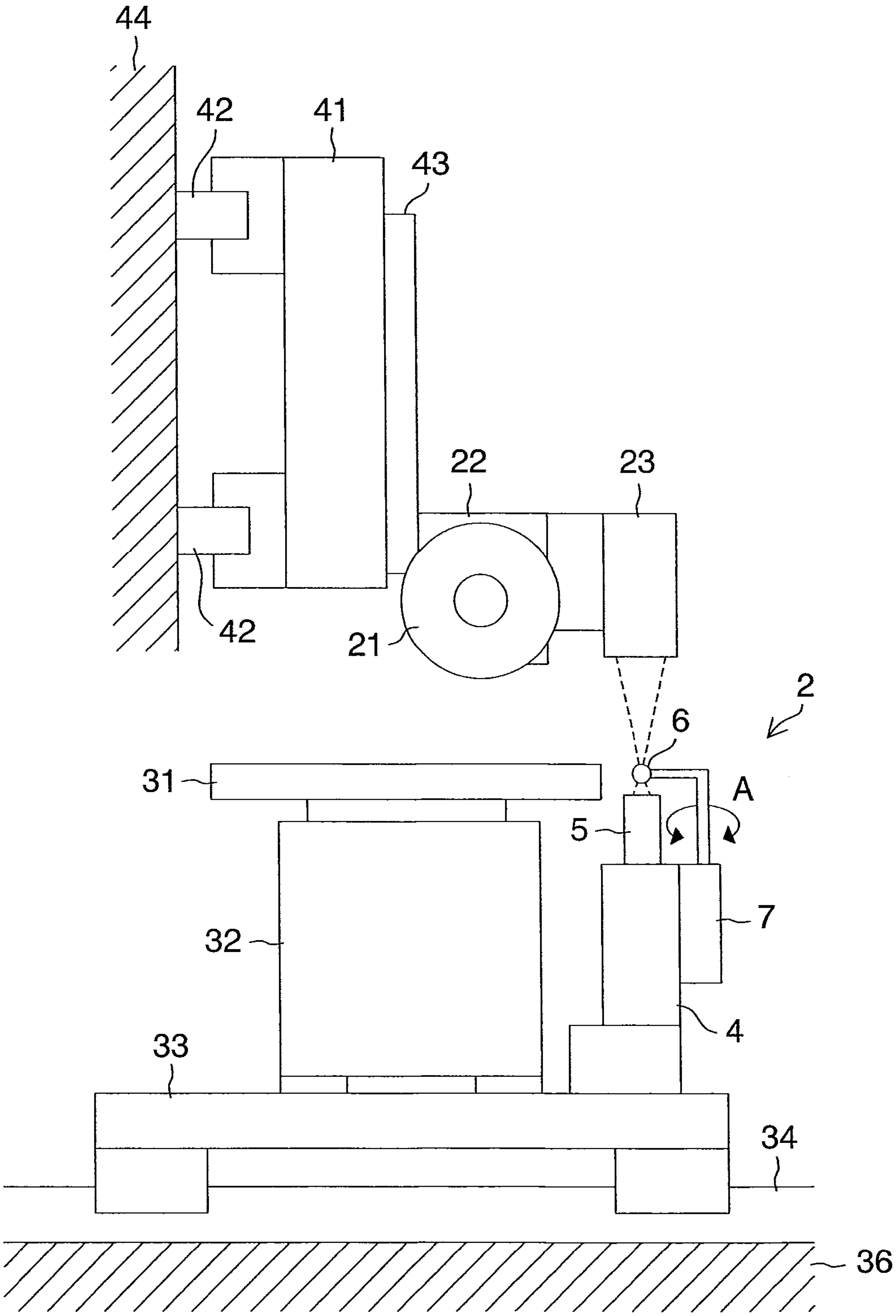
FIG. 7 is a side view showing the state where the position coordinates of the imaging device with respect to the alignment camera are acquired.
Figure 8:
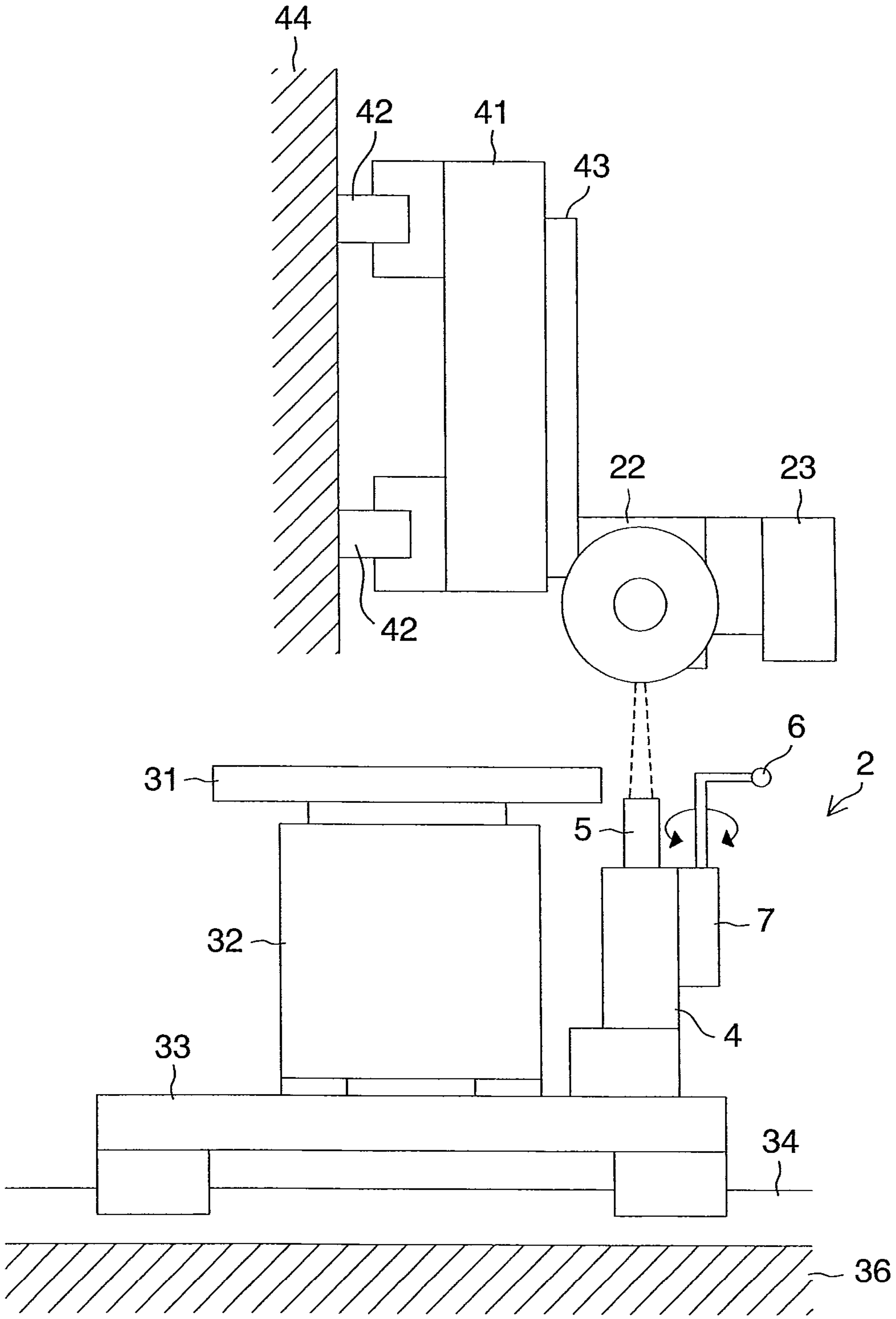
FIG. 8 is a side view showing the state where the position coordinates of the processing device with respect to the alignment camera are acquired.

In the calculation of the relative position between the imaging device 23 and the blade 21 as the processing device, first as shown in FIG. 7, the reference mark 6, which is provided at the center or near the center of the visual field of the alignment camera 2, is simultaneously imaged by both the imaging device 23 and the alignment camera 2. Thereby, the relative position coordinates of the imaging device 23 with respect to the alignment camera 2 are calculated.

Subsequently, the X table 33 and the Y table 41 are moved so that the alignment camera 2 is positioned vertically downward from the rotation center of the blade 21, and the reference mark 6 is moved to the outside of the visual field of the alignment camera 2 by the reference mark drive device 7. In this state, the relative position coordinates of the blade 21 with respect to the alignment camera 2 are calculated by imaging the blade 21 by the alignment camera 2.

The thus calculated relative position coordinates of the imaging device 23 with respect to the alignment camera 2, and the thus calculated relative position coordinates of the blade 21 with respect to the alignment camera 2 are stored in the storing device and processed by the controller, so that the relative position between the imaging device 23 and the blade 21 is calculated from the relative position coordinates of the imaging device 23 and the relative position coordinates of the blade 21. The alignment operation of the work W is performed on the basis of the calculated relative position, so that the cutting position of the work W and the position of the blade 21 are adjusted.

Thereby, it is possible to easily measure the relative position between the imaging device 23 and the blade 21 without processing the dummy work to know the cutting position by the blade 21, and it is possible to perform excellent dicing processing without lowering the efficiency of the dicing apparatus 1.

Further, in the dicing apparatus 1, when the blade 21 is imaged by the alignment camera 2, it is possible to know the outer diameter shape of the blade 21 from the position coordinates of the Z table 43 and the focal distance of the alignment camera 2 at the time when the imaging is performed. Thereby, it is possible to perform the set up operation, the measurement of the amount of abrasion wear of the blade 21, or the like, without bringing the blade 21 into contact with the work table 31.

Note that in the case where the laser head 61 shown in FIG. 3 is used as the processing device, the relative position coordinates of the laser head 61 with respect to the alignment camera 2 are calculated in such a manner that one of the places of the laser head 61, which places can be used as a reference, or the focal point of the laser beam L is aligned, by the alignment camera 2, on the imaging section 5 of the alignment camera 2.

Note that in the above described embodiments, a plurality of sets of the work table 31, the rotating table 32, the X table 33, and the alignment camera 2 may be provided.

As described above, according to the dicing apparatus and the dicing method of the present invention, by imaging each of the imaging device and the processing device by the alignment camera, it is possible to easily measure the relative position between the imaging device and the processing device without processing the dummy work, and it is possible to perform excellent dicing processing without lowering the efficiency of the dicing apparatus.

The invention claimed is:

1. A dicing apparatus, comprising:

a work table on which a work is mounted;

a processing device which processes the work;

an imaging device which images the work on the work table;

a plurality of moving devices which move the work table, the processing device, and the imaging device relatively to each other;

an alignment camera which is provided on the same moving device as the work table so as to face the imaging device, and which performs imaging in the direction toward the portion where the imaging device is provided; and a controller configured:

determine a first position of the imaging device with respect to the alignment camera when the alignment camera is in a first position, determine a first position of the processing device with respect to the alignment camera when the alignment camera is in a second position different from said first position of the alignment camera, and calculate a relative position between the imaging device and the processing device using the first position of the imaging device and the first position of the processing device.

2. The dicing apparatus according to claim 1, wherein a reference mark, which can be imaged by the alignment camera and the imaging device, is provided at the center or near the center of the visual field of the alignment camera.

3. The dicing apparatus according to claim 2, wherein the reference mark is movably provided so as to be able to be positioned at the center of the visual field of the alignment camera or near the center of the visual field, and outside the visual field.

4. The dicing apparatus according to claim 1, wherein a reference mark is movably provided so as to be able to be positioned at the center of the visual field of the alignment camera or near the center of the visual field, and outside the visual field.

5. The dicing apparatus according to claim 1, wherein the processing device and the imaging device are attached to the same rigid element of said dicing apparatus.

* * * * *